United States Patent [19]
Wang et al.

[11] Patent Number: 5,888,867
[45] Date of Patent: Mar. 30, 1999

[54] NON-UNIFORM THRESHOLD VOLTAGE ADJUSTMENT IN FLASH EPROMS THROUGH GATE WORK FUNCTION ALTERATION

[75] Inventors: Janet Wang; Scott D. Luning, both of San Francisco; Vei-Han Chan; Nicholas H. Tripsas, both of San Jose, all of Calif.

[73] Assignee: Advanced Micro Devices, Inc., Sunnyvale, Calif.

[21] Appl. No.: 23,241

[22] Filed: Feb. 13, 1998

[51] Int. Cl.$^6$ ................................ H01L 21/8247
[52] U.S. Cl. .................. 438/257; 438/291; 438/593; 438/525
[58] Field of Search .................. 438/593, 594, 438/291, 257, 525

[56] References Cited

U.S. PATENT DOCUMENTS

| | | |
|---|---|---|
| 4,714,519 | 12/1987 | Pfiester . |
| 4,745,079 | 5/1988 | Pfiester . |
| 5,360,751 | 11/1994 | Lee . |
| 5,521,108 | 5/1996 | Rostoker et al. . |
| 5,536,667 | 7/1996 | Cho . |

OTHER PUBLICATIONS

"Symmetric CMOS In Fully–Depleted Silicon–On–Insulator Using P+–Polycrystalline Si–Ge Gate Electrodes, " Neal Kistler and Jason Woo, *IEDM 93*, 727–730.

*Primary Examiner*—Richard A. Booth
*Attorney, Agent, or Firm*—Sawyer & Associates

[57] ABSTRACT

Aspects for forming a Flash EPROM cell with an adjustable threshold voltage are described. In a method aspect, the method includes forming a substrate structure to establish a foundation for cell formation, and forming a gate structure with a floating gate layer comprising polysilicon-germanium (poly-SiGe) of a non-uniform Ge concentration on the substrate structure. The method further includes forming source and drain regions within the substrate structure, the drain region having a different threshold voltage than the source region. In a further aspect, a Flash EPROM cell with an adjustable threshold voltage includes a substrate structure as a foundation for the cell. The cell further includes a gate structure on the substrate structure, the gate structure comprising a floating gate layer of polysilicon-germanium (poly-SiGe) of non-uniform Ge concentration. Additionally, source and drain regions are included in the substrate structure bordering the gate structure, the drain region having a differing threshold voltage than the source region.

14 Claims, 2 Drawing Sheets

NON-UNIFORM THRESHOLD VOLTAGE ADJUSTMENT IN FLASH EPROMS THROUGH GATE WORK FUNCTION ALTERATION

FIELD OF THE INVENTION

The present invention relates to Flash EPROMs, and more particularly to adjusting a threshold voltage for Flash EPROMs.

BACKGROUND OF THE INVENTION

Nonvolatile programmable memories operate similar to read only memories with the attribute of being programmable at least once. Included in nonvolatile memory types are Flash EPROMs (ultraviolet erasable programmable read only memories). Typical Flash EPROM cell structures are either charged or discharged in order to program or erase the cells and store information. In general terms, charging refers to the activity of putting electrons onto a floating gate of the cell, while discharging refers to the activity of taking electrons off of the floating gate of the cell. When charged, the cell has a low current and a high threshold voltage, $V_t$. Conversely, when discharged, the cell has a high current and a low $V_t$. A typical charged $V_t$ is usually 5V, and a typical discharged $V_t$ is usually 2V. In addition, in general, the ultraviolet threshold voltage ($UVV_t$), which is used to define the $VV_t$, of the device when the floating gate does not have any charge, i.e., when in a charge neutral state, is also about 2V, making the discharged state and the UV erased state the same.

Currently, the $UVV_t$ is determined in large part by the doping of the core cell channel. However, the doping of the channel is also dependent on the need to control problems due to short channel effect. The short channel effect generally refers to the problem associated with drain induced barrier lowering (DIBL) and threshold voltage roll-off with channel length. Presently, scaling down of Flash EPROM cells has been considered critical in continuing the trend toward higher device density. As the size of the cells shrink, the short channel effect becomes problematic. With larger cell sizes, the channel between the source and drain is long and the transient electrical field generated is very small during the charging period, i.e., during the period when the voltage is applied to the source. However, as the channel becomes shorter due to cell size shrinkage, short channel effect becomes significant.

While altering the doping in the channel is typically utilized to counteract the short channel effect as device sizes shrink, unfortunately, changes in the doping in the channel may adversely change the threshold voltage. Too high of a doping level not only can make the short channel effect worse but can also translate to a higher threshold voltage for the cell. Thus, optimized channel doping levels for combatting short channel effect often produce less than optimal threshold voltage values, and vice versa.

Accordingly, a need exists for a manner of providing a flash EPROM cell that has greater flexibility in optimizing core channel implant for short channel effect while maintaining desired threshold voltage.

SUMMARY OF THE INVENTION

The present invention meets this need and provides aspects for forming a Flash EPROM cell with an adjustable threshold voltage. In a method aspect, the method includes forming a substrate structure to establish a foundation for cell formation, and forming a gate structure with a floating gate layer comprising polysilicon-germanium (poly-SiGe) of a non-uniform Ge concentration on the substrate structure. The method further includes forming source and drain regions within the substrate structure, the drain region having a different threshold voltage than the source region.

In a further aspect, a Flash EPROM cell with an adjustable threshold voltage includes a substrate structure as a foundation for the cell. The cell further includes a gate structure on the substrate structure, the gate structure comprising a floating gate layer of polysilicon-germanium (poly-SiGe) of non-uniform Ge concentration. Additionally, source and drain regions are included in the substrate structure bordering the gate structure, the drain region having a differing threshold voltage than the source region.

With the present invention, a non-uniform gate work function is utilized to optimize hot carrier programmability at the drain and erase at the source of a Flash EPROM cell. These and other advantages of the aspects of the present invention will be more fully understood in conjunction with the following detailed description and accompanying drawings.

DETAILED DESCRIPTION

The present invention relates to the gate structure of Flash EPROM cells that is altered through the introduction of germanium into a floating gate. The following description is presented to enable one of ordinary skill in the art to make and use the invention and is provided in the context of a patent application and its requirements. Various modifications to the preferred embodiment and the generic principles and features described herein will be readily apparent to those skilled in the art.

Figure 1:
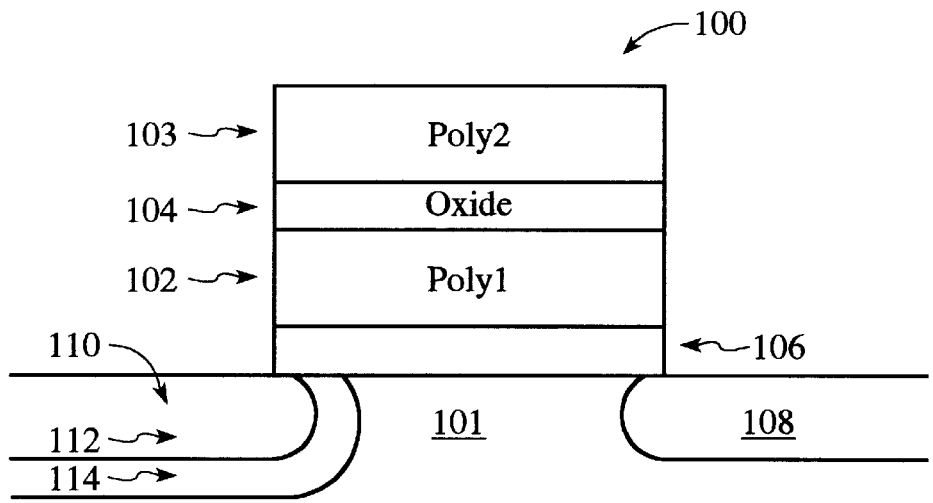
FIG. 1 illustrates a cross-sectional view of a conventional Flash EPROM cell.

FIG. 1 illustrates a cross-sectional view of a Flash EPROM cell 100 that has been processed in accordance with the prior art through the subsequent source and drain implant. The cell 100 includes first and second polysilicon (poly-Si) layers 102 and 103, i.e., floating gate and control gate, respectively, and an oxide region 104 therebetween, e.g., an oxide-nitride-oxide (ONO) region. A tunnel oxide region 106 is further included with a thickness of between about 80–100 angstroms, for example, between the first poly-Si layer 102 and the substrate 101, e.g., silicon area. A first implant 114 is optional, but typically is provided in source region 1 10 to reduce unwanted band-to-band tunneling current. As is shown, the implant could be brought to a position well inside the gate area of the device. A second implant 112 is performed to provide source/drain regions 112/108. The second implant with its high surface concentration under the source overlap region suitably facilitates the proper erasure of the flash code, as is well understood by those skilled in the art. Typically, the substrate 101 is doped with a p-type dopant, such as boron, while the source and drain regions are doped with an n-type dopant, such as phosphorous or arsenic, as is well known to those skilled in the art. As is further well understood, a core implant of boron of approximately $10^{17}$ atoms/cm$^3$ is usually done at the surface of the substrate 101. This surface doping typically creates an ultraviolet threshold voltage, UVVt, approximately equal to the discharge threshold voltage, $V_t$, for example 2V.

As discussed above, the core channel doping, i.e., surface doping and source/drain doping, is usually adjusted to combat short channel effects in the cell 100. These adjustments to the channel doping alter the $V_t$ for the cell. The following equation presents a conventional equation for threshold voltage:

$$V_t = V_{FB} - 2\phi_B - Q_B/C_{ox} = \phi_{ms} - Q_{ox}/C_{ox} - 2\phi_B - Q_B/C_{ox} \quad (1)$$

Typically, the attempts to alter threshold voltage of a cell through doping adjustments corresponds with an alteration to the value of the term $Q_B/C_{ox}$ of equation (1). Through the aspects of the present invention, predetermined, optimal doping levels for the core cell channel to account for the short channel effect are utilized and unaltered. Desired adjustments to the threshold voltage value are capably achieved through an alteration to the material of a floating gate layer, which adjusts the gate work function for the cell, i.e., the work function difference between the gate and substrate of the cell. Thus, according to equation (1), the change in work function adjusts the value represented by $\phi_{ms}$.

Figure 2A:
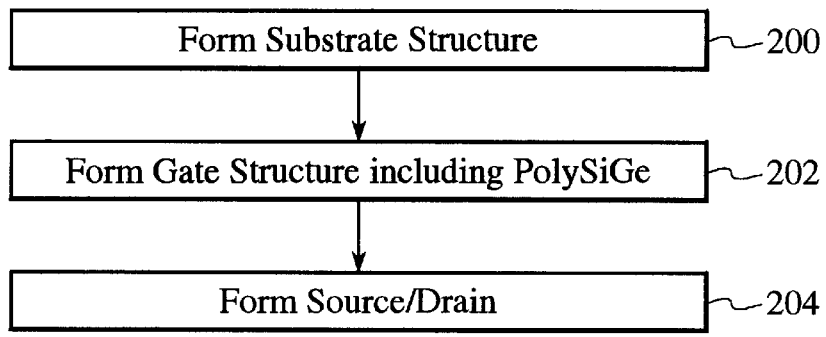
FIG. 2a illustrates a block flow diagram of a process for providing a Flash EPROM cell with an altered gate structure in accordance with a preferred embodiment of the present invention.
Figure 2B:
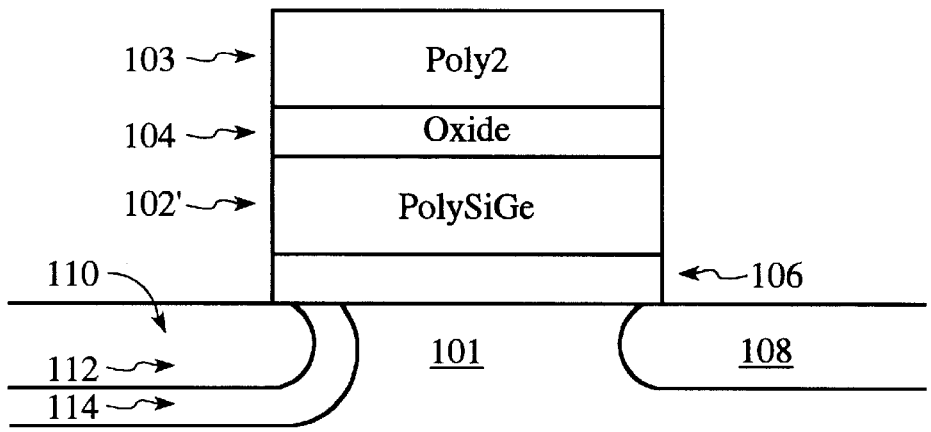
FIG. 2b illustrates a cross-sectional view of the Flash EPROM cell with an altered gate structure in accordance with the present invention.

The gate work function is suitably adjusted through selection of an appropriate gate material, as described with reference to a block flow diagram of an overall process for the present invention illustrated in FIG. 2a. As shown in FIG. 2a, a substrate structure is suitably formed through well known techniques to establish a foundation for cell formation (step 200). Formation of a gate structure then occurs (step 202) with a floating gate layer comprising polysilicon-germanium (poly-SiGe), as described in more detail hereinbelow with reference to alternate embodiments of the present invention illustrated in FIG. 3 and 4. Source and drain formation subsequently occurs (step 204) through conventional doping techniques. Preferably, predetermined desired levels of doping are used to counteract the short channel effect and optimize Flash operation. FIG. 2b suitably illustrates a cross-sectional view of the resultant cell structure including the poly-SiGe floating gate layer 102'.

Figure 3:
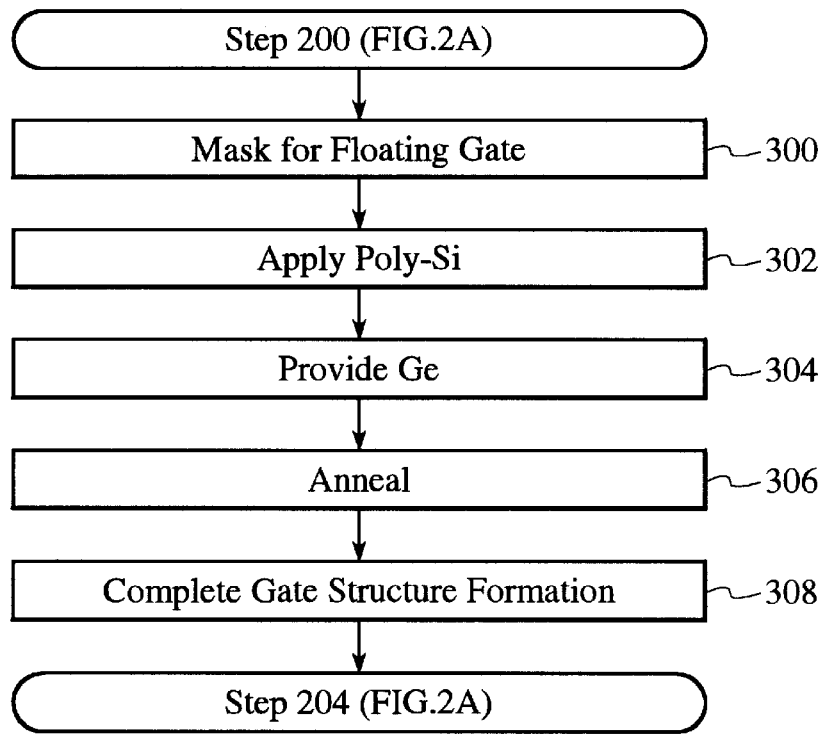
FIG. 3 illustrates a block flow diagram of an embodiment of forming the altered gate structure with germanium implantation.
Figure 4:
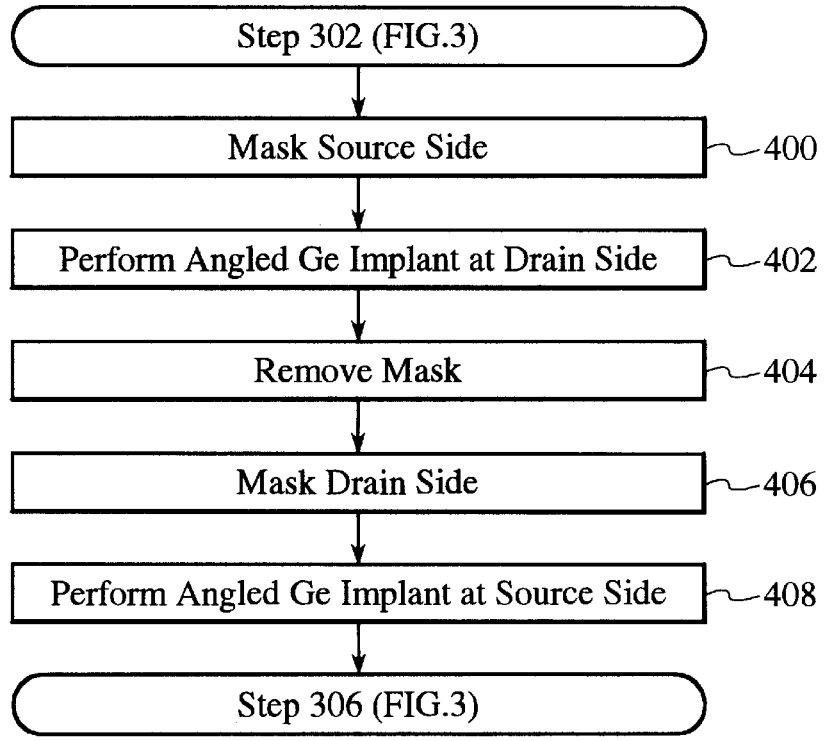
FIG. 4 illustrates a block flow diagram of another embodiment of forming the altered gate structure with a non-uniform germanium implantation.

Referring now to FIG. 3, in one aspect of the present invention, formation of the floating gate layer with Ge implant initiates with masking of the substrate structure, e.g., substrate 101 and oxide 106, FIG. 2b, as is well understood by those skilled in the art (step 300). A first level poly-silicon (poly-Si) layer is then applied through well known techniques to initiate formation of the floating gate of the cell (step 302). In contrast to conventional cell formation, an implantation of germanium (Ge) into the poly-Si then occurs (step 304). The amount of implanting necessary is design dependent and suitably is chosen to achieve the desired work function value, which, when combined with the predetermined channel doping level, results in the desired threshold voltage for the cell in accordance with equation (1). By way of example, a 50% Ge content would be suitable. The implanted layer is then preferably annealed (step 306) to form poly-SiGe as the floating gate layer, before the mask is removed and the rest of the gate structure, i.e., oxide layer 104 and control gate/poly 2 layer 103, is formed (step 308).

While implanting the poly-Si with Ge adjusts the work function as desired, a further embodiment performs the implanting of the Ge in an alternate fashion to provide greater selectivity of the threshold voltage for the cell. In accordance with this further embodiment, a non-uniform work function is achieved to optimize hot-carrier programmability at the drain and erase functionality at the source by setting different UVV$_t$ values at the drain and source, respectively. The non-uniform work function is suitably provided through an alteration in the implanting of the Ge (step 304, FIG. 3), as discussed with reference to the block flow diagram of FIG. 4.

In order to provide the non-uniform work function, suitably conventional masking is utilized over the poly-Si layer to cover a source side of the cell (step 400). An angled implant of Ge then occurs at a drain side of the cell (step 402). The level of Ge used is again design dependent but is preferably chosen to achieve a lower threshold voltage at the drain than at the source. The mask is suitably removed (step 404) through conventional methods, and a second mask is then applied to cover a drain side of the cell (step 406). An angled Ge implant then suitably occurs at the source side of the cell (step 408) with the level of implant chosen to provide a higher threshold voltage at the source side of the cell than at the drain side of the cell. Since the addition of Ge in the poly-Si lowers the gate work function, suitably the percentage content of Ge in the poly-SiGe present on the drain side of the floating gate is greater than on the source side to achieve a lower UVV$_t$ on the drain side than on the source side. The process suitably continues with annealing (step 306, FIG. 3) and the remaining gate and cell formation as described with reference to FIGS. 2a and 3. Alternatively, an implant of Ge in the entire floating gate at the desired level for the source side could occur before a masking of the source side during an angled implant in the drain side. Accordingly, an increase in the implant dose at the drain side would occur and would alleviate the steps of masking and unmasking of the drain side.

Through the aspects of the present invention, an alteration in floating gate layer formation offers greater flexibility in achieving desired threshold voltages in Flash EPROM cells. Further, doping levels can remain at predetermined levels to avoid short channel effect problems. Thus, while adding to the normal processing techniques, the present invention achieves a balance between threshold voltage and doping level requirements in forming Flash EPROM cells.

Although the present invention has been described in accordance with the embodiments shown, one of ordinary skill in the art will recognize that there could be variations to the embodiment and those variations would be within the spirit and scope of the present invention. Accordingly, many modifications may be made by one of ordinary skill without departing from the spirit and scope of the present invention, the scope of which is defined by the following claims.

What is claimed is:

1. A method for forming a Flash EPROM cell with an adjustable threshold voltage, the method comprising the sequential steps of:

forming a substrate structure to establish a foundation for cell formation;

forming a gate structure with a floating gate layer comprising polysilicon-germanium (poly-SiGe) of a non-uniform Ge concentration on the substrate structure; and forming source and drain regions within the substrate structure, the drain region having a different threshold voltage than the source region.

2. The method of claim 1 wherein forming a gate structure further comprises forming a polysilicon layer as a basis for the floating gate layer.

3. The method of claim 2 wherein forming a gate structure further comprises masking the polysilicon layer over a source side and performing an angled implant of germanium into the polysilicon layer at a drain side to achieve a first level of concentration in the polysilicon layer at the drain side.

4. The method of claim 3 wherein forming a gate structure further comprises unmasking the source side, masking the drain side, and performing an angled implant of germanium into the polysilicon layer at the source side to achieve a second level of concentration in the polysilicon layer at the source side.

5. The method of claim 4 wherein forming a gate structure further comprises unmasking the drain side and annealing the polysilicon layer with implanted germanium to form the floating gate layer.

6. The method of claim 5 wherein forming a gate structure further comprises forming an oxide layer over the floating gate layer and forming a control gate over the oxide layer.

7. The method of claim 6 wherein the oxide layer comprises oxide-nitride-oxide.

8. The method of claim 7 wherein forming source and drain regions further comprises doping.

9. The method of claim 8 wherein doping further comprises doping at predetermined levels to counteract short channel effect in the cell.

10. A method for altering a threshold voltage of a Flash EPROM cell, the method comprising:

maintaining a predetermined channel doping level for the Flash EPROM cell; and supplementing material non-uniformly in a first gate layer of the Flash EPROM cell to provide a non-uniform gate work function in the cell by implanting the first gate layer with germanium.

11. The method of claim 10 wherein the first gate layer comprises a polysilicon gate layer.

12. The method of claim 11 wherein implanting with germanium further comprises providing a first level of germanium implantation at a source side of the polysilicon gate layer and providing a second level of germanium implantation at a drain side of the polysilicon gate layer.

13. The method of claim 12 wherein providing first and second levels of germanium implantation occurs through angled implantation.

14. The method of claim 12 wherein the first and second levels of germanium create a higher threshold voltage on the source side than on the drain side.

* * * * *